United States Patent
Nalbandian et al.

(10) Patent No.: US 7,061,220 B1
(45) Date of Patent: Jun. 13, 2006

(54) PASSIVE RADIO FREQUENCY POWER SPECTRUM ANALYZER

(75) Inventors: Vahakn Nalbandian, Tinton Falls, NJ (US); Ernest Potenziani, II, Tinton Falls, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 141 days.

(21) Appl. No.: 10/886,273

(22) Filed: Jun. 24, 2004

(51) Int. Cl.
*G01R 23/00* (2006.01)
(52) U.S. Cl. ............................. 324/76.19; 324/76.22; 324/633
(58) Field of Classification Search ............ 324/76.19, 324/76.22, 307–309, 318–322, 633
See application file for complete search history.

(56) References Cited

U.S. PATENT DOCUMENTS

| 5,057,803 | A | | 10/1991 | Ooi et al. | |
| 5,276,398 | A | * | 1/1994 | Withers et al. | 324/318 |
| 5,565,778 | A | * | 10/1996 | Brey et al. | 324/318 |
| 5,585,723 | A | * | 12/1996 | Withers | 324/318 |
| 5,616,540 | A | | 4/1997 | Lithgow et al. | |
| 5,661,400 | A | * | 8/1997 | Plies et al. | 324/318 |
| 6,137,381 | A | | 10/2000 | Remillard et al. | |
| 6,392,232 | B1 | * | 5/2002 | Gooch et al. | 250/332 |
| 6,392,397 | B1 | | 5/2002 | Thomas | |
| 6,407,555 | B1 | * | 6/2002 | Joshi et al. | 324/636 |
| 6,825,742 | B1 | * | 11/2004 | Luque | 333/204 |
| 6,917,205 | B1 | * | 7/2005 | Moller et al. | 324/663 |
| 2003/0052678 | A1 | * | 3/2003 | Gerald et al. | 324/318 |

\* cited by examiner

*Primary Examiner*—Anjan Deb
*Assistant Examiner*—Marina Kramskaya
(74) *Attorney, Agent, or Firm*—Michael Zelenka; Roger C. Phillips; George B. Tereschuk

(57) ABSTRACT

A spectrum analyzer includes a resonator board that in turn has a substrate and a plurality of resonators. Each resonator may include a first segment that includes a first segment discontinuity and that may also define a boundary and a second segment that has a second segment discontinuity. The second segment may be spaced from the first segment and wherein the second segment is disposed within the boundary defined by the first segment. The resonator board may also include a plurality of wires each of which may be generally parallel to each other and each having a resonator interposed therebetween.

17 Claims, 3 Drawing Sheets

PASSIVE RADIO FREQUENCY POWER SPECTRUM ANALYZER

GOVERNMENT INTEREST

The invention described herein may be manufactured, used, imported, sold, and licensed by or for the Government of the United States of America without the payment of any royalty thereon or therefor.

BACKGROUND OF THE INVENTION

1. Field of the Invention

The present invention relates generally to devices and methods for analyzing an electromagnetic signal and, more particularly, to devices and methods of analyzing an electromagnetic signal power spectrum.

2. Related Art

Spectrum analyzers for use in analyzing signals at radio frequencies are available. For example, U.S. Pat. No. 6,392,397 to Thomas describes a spectrum analyzer that includes a frequency converter for converting, at each of a series of frequency settings, a received radio frequency signal into an intermediate frequency signal, each intermediate frequency signal being derivable from more than one nominal received radio frequency signals. The converter includes a frequency synthesizer for synthesizing the frequencies of the frequency settings and a mixer for mixing each synthesized frequency with the received radio frequency signal in a complex manner such that the candidate frequency intervals corresponding to an arbitrary frequency interval $F_{if}$ are given by $N.F_{ref} \pm F_{if}$, where N is any positive integer and $F_{ref}$ is the synthesized frequency.

In operation, the spectrum analyzer carries out a frequency analysis of each intermediate frequency signal to produce a power spectrum thereof and constructs a composite received radio frequency signal power spectrum corresponding to each intermediate frequency signal power spectrum. The composite radio frequency signal power spectrums are then operated on by the spectrum analyzer to provide the actual power spectrum of the received radio frequency signal.

Such a power spectrum analyzer suffers from the drawback of high cost and complexity resulting from extensive circuitry including filters, dividers, clocks, etc.

SUMMARY OF THE INVENTION

In accordance with an embodiment of the present invention, a spectrum analyzer comprises a resonator board that in turn comprises a substrate and a plurality of resonators. Each resonator may comprise a first segment that comprises a first segment discontinuity and that may also define a boundary and a second segment that comprises a second segment discontinuity. The second segment may be spaced from the first segment and wherein the second segment is disposed within the boundary defined by the first segment. The resonator board may also comprise a plurality of wires each of which may be generally parallel to each other and having a resonator interposed therebetween.

BRIEF DESCRIPTION OF THE DRAWINGS

The following detailed description is made with reference to the accompanying drawings, in which.

DETAILED DESCRIPTION OF THE PREFERRED EMBODIMENT

One embodiment of the present invention concerns a device and a method for analyzing an electromagnetic power spectrum preferably in the radio frequency (RF) range. The device is lightweight and simple as compared with prior devices and methods and may comprise a matrix of resonators and wires configured to focus a particular wavelength of a signal at a particular angle. An array of detectors may be spaced from the resonators, e.g., split ring resonators, to indicate a particular wavelength based on the angle at which the signal is focused.

Figure 1:
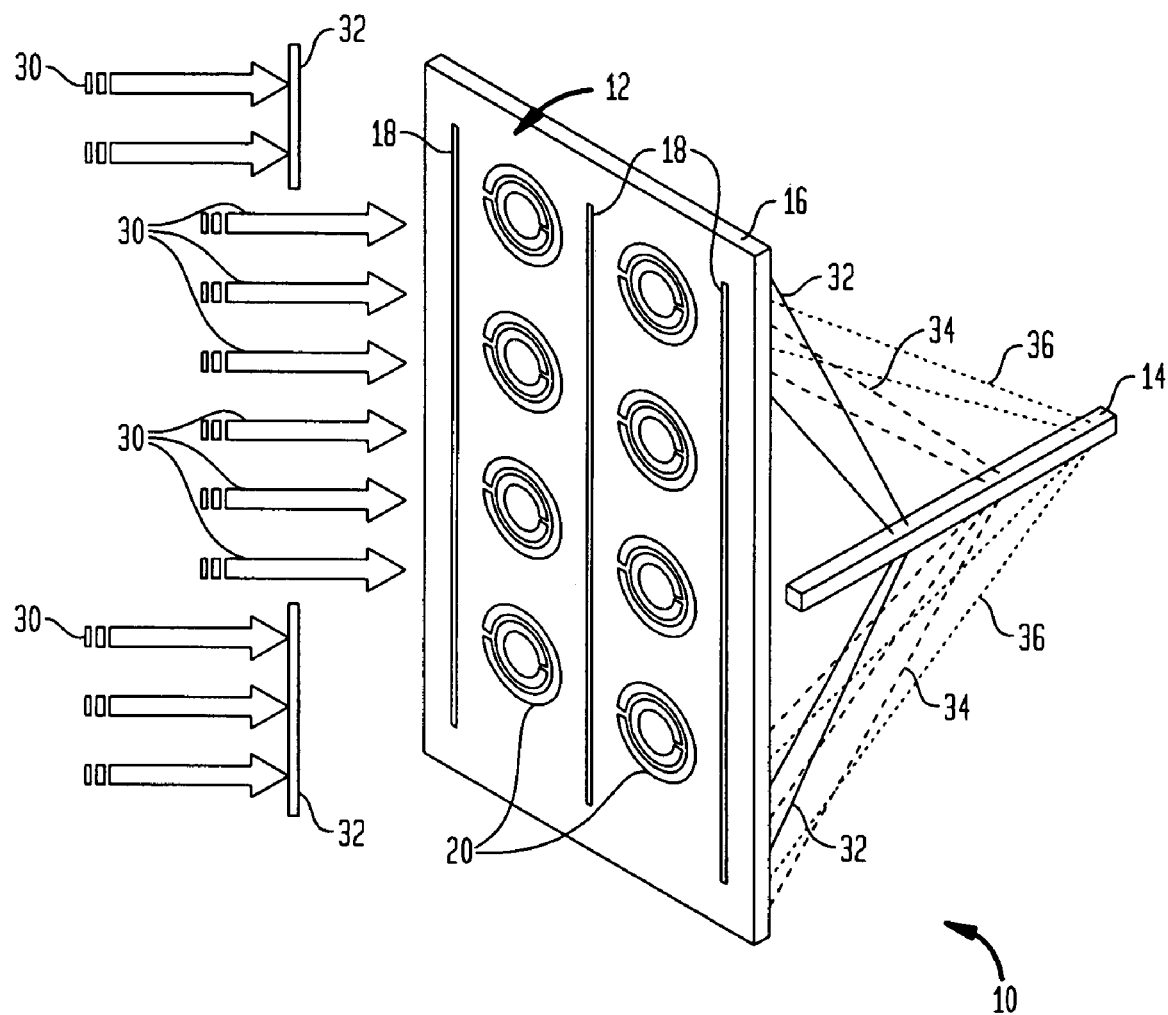
FIG. 1 is a diagram showing a power spectrum analyzer comprising a matrix of resonators, generally parallel wires and an array of detectors in accordance with one embodiment of the present invention.

Referring now to FIG. 1, a power spectrum analyzer in accordance with one embodiment of the present invention is illustrated generally at 10. In this embodiment, the power spectrum analyzer 10 comprises a resonator assembly or board 12 and an array of detectors 14.

The resonator board 12 may comprise a substrate 16, wires 18 and resonators 20. The substrate 16 comprises a dielectric material such as PTFE or FR-4 and is more preferably a ceramic material manufactured by the Rogers Corporation of Rogers, Conn.

The wires 18 may comprise a metallic substance such as copper (Cu), Tin (Sn), aluminum (Al), Silver (Ag) or Gold (Au) and may be deposited on the substrate via, e.g., chemical vapor deposition (CVD) or formed via photolithography. The wires 18 are preferably deposited in such a manner that they are generally parallel to one another and in combination with the resonators 20 comprise a periodic matrix of resonators and parallel wires. The wires 18 are preferably located midway between the between the resonators 20 and such that the spacing between each of the wires and each of the resonators is generally equivalent. The wires 18 may comprise a thickness that is approximately five to ten times the skin depth. For example, at about 10 GHz, the skin depth of a copper wire may be approximately 670 nanometers and, accordingly, the thickness may be approximately 6700 nanometers or about 0.275 mils.

The resonators 20 may form rows and/or columns and in combination with the generally parallel wires 18 are believed to form a "left-handed" material at microwave frequencies. A left-handed material may be generally defined as possessing a negative index of refraction, n, where, both the electrical permittivity ($\epsilon$) and the magnetic permeability ($\mu$) are simultaneously negative. The wires 18 may provide a negative permittivity aspect by acting on an electrical component of an electromagnetic field. The resonators 20 may provide a negative permeability effect by acting on a magnetic component of an electromagnetic wave. Also, the resonator board 12 is shown for illustrational purposes as comprising a two by four matrix of resonators 20, although, it will be understood that merely a plurality of resonators may be employed in the practice of the invention.

Figure 2:
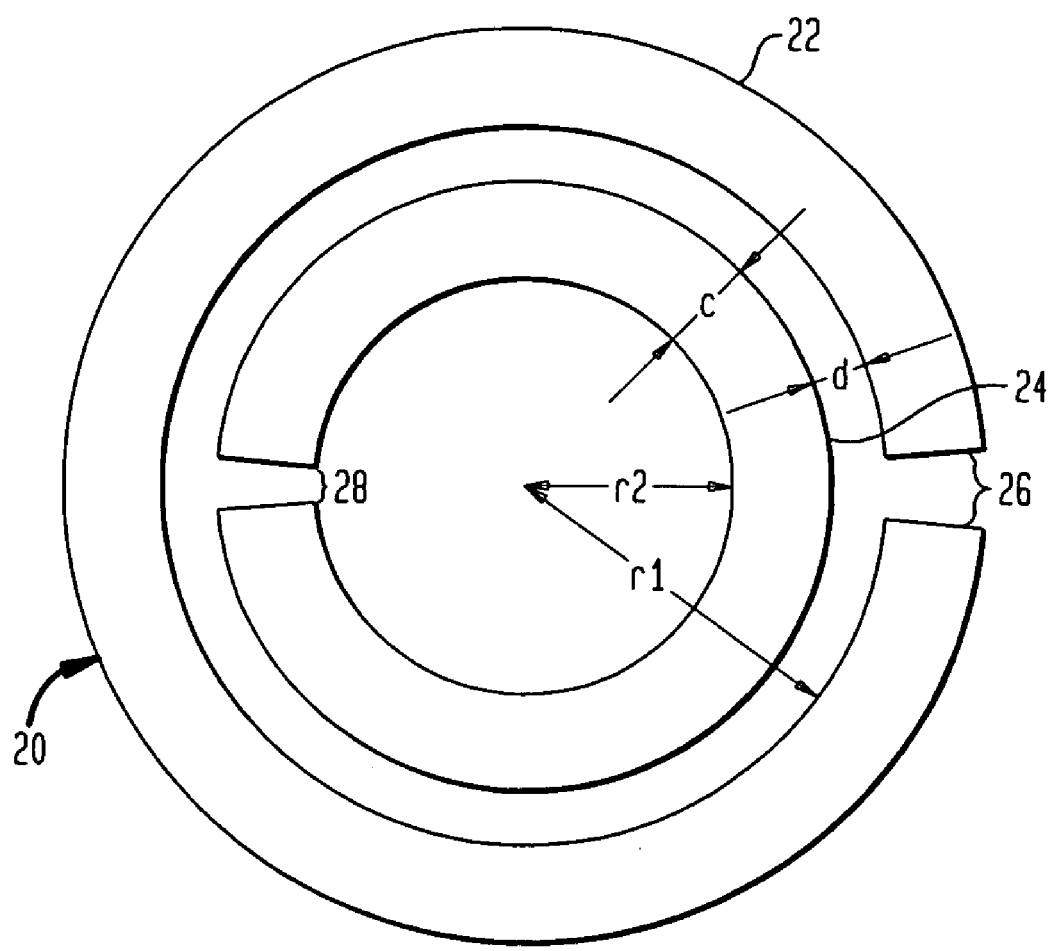
FIG. 2 is a diagram showing further details of a resonator of FIG. 1.

Referring now to FIG. 2, each resonator 20 may comprise a pair of segments 22, 24 comprising a metallic substance such as copper (Cu), Tin (Sn), aluminum (Al), Silver (Ag) or Gold (Au). Similar to wires 18, the segments 22, 24 may be deposited or formed on the substrate 16. The segments 22, 24 preferably comprise rings as shown, although, it will be understood that other geometrical shapes such as squares, rectangles and combinations thereof may be employed. The segments 22, 24 comprise splits or discontinuities 26 that may function to decrease the resonant frequency of the segment and thereby substantially reduce the dimension of the segments for a given wavelength. The segments 22, 24, as shown on the substrate 16 (FIG. 1), together generally define a single plane, although, it will be appreciated that other configurations such as that defining multiple planes may be utilized.

For analyzing a power spectrum of radio frequency signals, the segments 22, 24 may be separated as shown by the dimension (d) that may be within the range of between approximately 0.1 mm and 1.0 mm. Each segment 22, 24 may have a thickness (c) that is within the range of between approximately 0.1 mm and 1.0 mm. Segment 22 may have an inner radius (r1) that may be within the range of between approximately 15 mm and 1.5 mm and segment 24 may have an inner radius (r2) that may be within the range of between approximately 12 mm and 1.2 mm. The foregoing dimensions are provided for illustrational purposes only and, it will be recognized that, each of the dimensions depend on the center frequency or wavelength that is to be analyzed. For example, for the separation dimension (d) of segments 22 and 24, 1 mm would be suitable for a few GHz whereas 0.1 mm would be more appropriate for 10 GHz.

Referring again to FIG. 1, the array of detectors 14 may be mounted on a support (not shown) that extends in a linear direction that may be generally perpendicular to a plane defined by the resonator assembly 12. Each detector may comprise an active device with gain such as a microwave transistor for increased sensitivity or a passive device such as a bolometer.

During operation of the power spectrum analyzer 10, an electromagnetic signal, represented by arrows 30 is passed through a collimator that provides for parallel rays and restricts a portion of the electromagnetic signal as shown at 32. The electromagnetic signal then passes through the resonator board 12 whereby, because of the matrix of wires 18 and resonators 20 the signal is focused to a particular location depending upon its wavelength (see solid, dashed and dotted lines 32, 34 and 36). More specifically, it is believed that when an electromagnetic signal enters the resonator board 12, the signal encounters negative values of permeability ($\mu$) and permittivity ($\epsilon$), as described above, whereby the signal may suffer from chromatic aberrations. That is, different wavelengths come to a focus at different distances from the resonator board 12. Accordingly, the detectors 14 may be spaced linearly away from the resonator board 12 to thereby measure an amplitude for each wavelength whereby a frequency spectrum of the signal may be found. The detectors 14 may be located at a particular distance via calibration depending upon a desired wavelength or frequency.

Although not shown, it will be understood that several resonator boards 12 with wires 18 and resonators 20 of different dimensions (c, r1 and r2) and separations (d) may be combined to cover a broad frequency in accordance with the present invention. In such an arrangement, the electromagnetic signal would pass through the boards with the larger dimensions first, then progressively smaller dimensions. That way, in the initial resonator board 12, the longer wavelengths would be focused while the shorter wavelengths may pass through, relatively unaffected, to the next resonator board which would focus increasingly shorter wavelengths, and so on.

Figure 3:
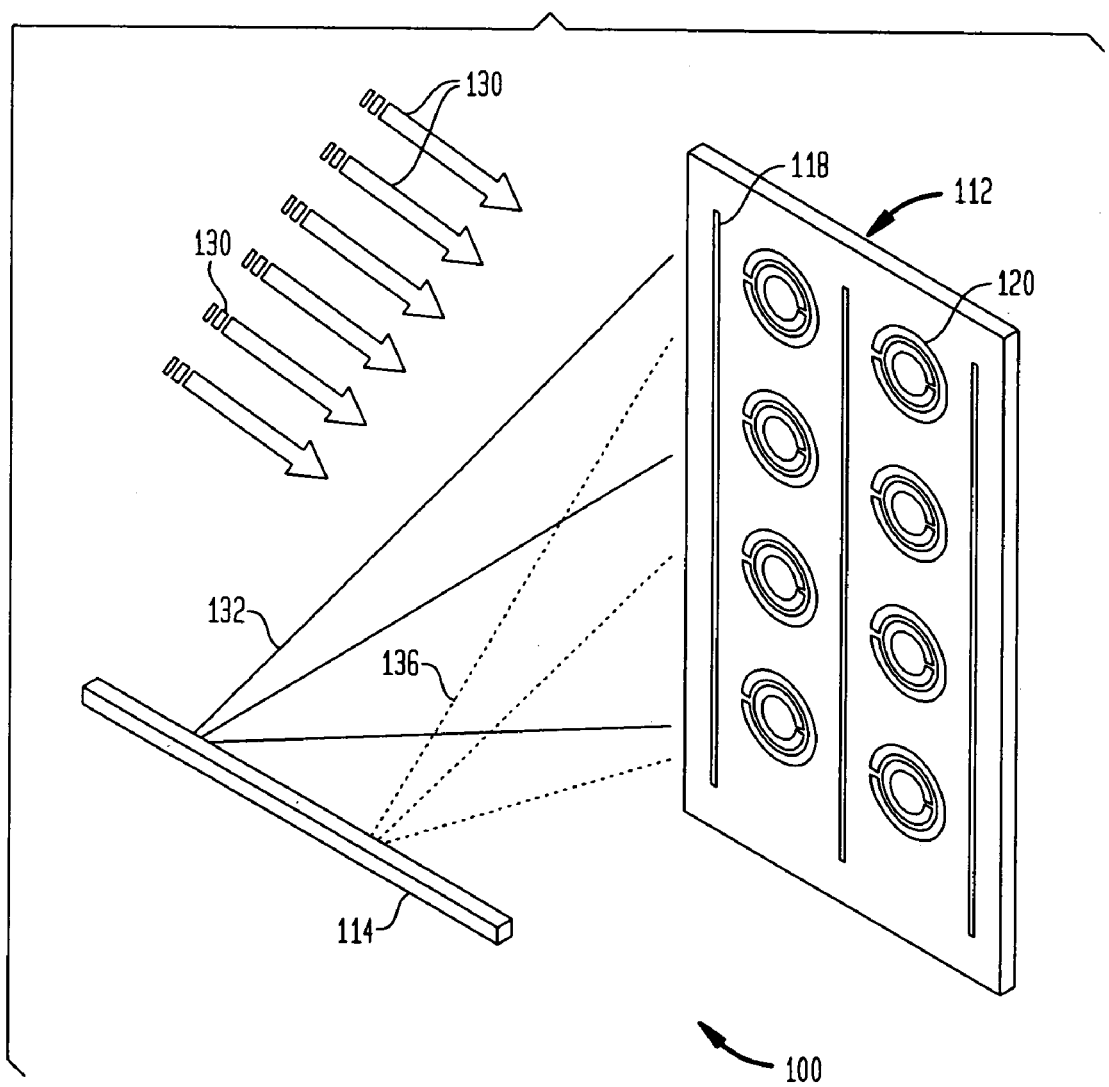
FIG. 3 is a diagram showing a power spectrum analyzer in accordance with another embodiment of the present invention.

Another embodiment of a power spectrum analyzer in accordance with the present invention is shown generally at 100 in FIG. 3. The power spectrum analyzer 100 may be generally similar to that described above in FIGS. 1 and 2, and corresponding components are labeled correspondingly, although, preceded by a one. Reference for the particular aspects and functions of each component may be had above.

A difference in the power spectrum analyzer 100 from that of the power spectrum analyzer 10 is that the resonator board 112 is operated, as shown, in a reflective mode rather than a transmissive mode. In this way, it will be appreciated that electromagnetic signals will be reflected and focused for receipt by a particular detector in the array of detectors 114 in accordance with wavelength. Thereafter, the amplitude of each wavelength may be measured to provide a power spectrum analysis for the electromagnetic signal 130. it will be recognized that at higher frequencies, the reflective mode may be preferable to the transmissive mode because it should suffer much lower losses.

While the present invention has been described in connection with what are presently considered to be the most practical and preferred embodiments, it is to be understood that the present invention is not limited to these herein disclosed embodiments. Rather, the present invention is intended to cover all of the various modifications and equivalent arrangements included within the spirit and scope of the appended claims.

What is claimed is:

1. A spectrum analyzer, comprising:
   a resonator board comprising:
   a substrate;
   a plurality of resonators each of which comprising:
   a first segment comprising a first segment discontinuity, the first segment defining a boundary; and
   a second segment comprising a second segment discontinuity;
   wherein the second segment is spaced from the first segment and wherein the second segment is disposed within the boundary defined by the first segment; and
   a plurality of wires, the wires each being generally parallel to each other and having a resonator interposed therebetween;
   wherein the resonator board further comprises multiple pairs of resonators and multiple wires arranged in a periodic matrix; and
   further comprising an array of detectors operatively disposed in proximity to the matrix of resonators and wherein each of the resonators are configured to focus an electromagnetic signal at a particular angle based on the wavelength of the signal and wherein the array of detectors is configured such that receipt of the signal at a particular detector indicates a particular wavelength.

2. The device of claim 1, wherein the first segment and the second segment each comprise a ring-like configuration.

3. The device of claim 1, wherein the first segment and the second segment are co-axially disposed.

4. The device of claim 1, wherein the wires, the first segment and the second segment are disposed generally in a single plane.

5. The device of claim 1, wherein the wires, the first segment and the second segment are each composed of conductive materials.

6. The device of claim 5, wherein the wires, the first segment and the second segment each comprise at least one substance from the group consisting of copper, aluminum, silver and gold.

7. The device of claim 1, wherein the substrate comprises a dielectric material.

8. The device of claim 7, wherein the dielectric material comprises a ceramic.

9. The device of claim 1, wherein the first segment and the second segment each comprise a width (w) which is in the range of between approximately 1.0 mm and approximately 0.1 mm.

10. The device of claim 1, wherein the first segment and the second segment are spaced apart by a distance (d) which is in the range of between approximately 0.1 mm and approximately 1.0 mm.

11. The device of claim 2, wherein the first segment comprises an inner radius that is in the range of between approximately 1.5 mm and approximately 15 mm.

12. The device of claim 2, wherein the second segment comprises an inner radius that is in the range of between approximately 1.2 mm and approximately 12 mm.

13. The device of claim 2, wherein the first segment comprises a first inner radius and the second segment comprises a second inner radius and wherein the first inner radius is greater than the second inner radius.

14. The device of claim 1, further comprising a collimator located adjacent the matrix of resonators and wherein each of the detectors is also configured to measure an amplitude.

15. The device of claim 1, wherein the periodic matrix is transmissive of the electromagnetic signal.

16. The device of claim 1, wherein the periodic matrix is reflective of the electromagnetic signal.

17. The device of claim 1, wherein the electromagnetic signal comprises a microwave frequency signal.

* * * * *